(12) United States Patent
Chen et al.

(10) Patent No.: US 7,447,025 B2
(45) Date of Patent: Nov. 4, 2008

(54) HEAT DISSIPATION DEVICE

(75) Inventors: Chun-Chi Chen, Guangdong (CN); Shi-Wen Zhou, Guangdong (CN); Zhan Wu, Guangdong (CN)

(73) Assignees: Fu Zhun Precision Industry (Shen Zhen) Co., Ltd., Shenzhen, Guangdong Province; Foxconn Technology Co., Ltd., Tu-Cheng, Taipei Hsien (TW)

( * ) Notice: Subject to any disclaimer, the term of this patent is extended or adjusted under 35 U.S.C. 154(b) by 225 days.

(21) Appl. No.: 11/163,820

(22) Filed: Nov. 1, 2005

(65) Prior Publication Data

US 2007/0097637 A1    May 3, 2007

(51) Int. Cl.
*H05K 7/20* (2006.01)
*F28F 7/00* (2006.01)

(52) U.S. Cl. .................. 361/696; 165/80.3; 165/121; 165/104.33; 361/695; 361/697; 361/700

(58) Field of Classification Search .............. None
See application file for complete search history.

(56) References Cited

U.S. PATENT DOCUMENTS

| | | | |
|---|---|---|---|
| 5,285,347 A * | 2/1994 | Fox et al. ............... | 361/699 |
| 5,339,214 A * | 8/1994 | Nelson ................. | 361/695 |
| 6,587,343 B2 * | 7/2003 | Novotny et al. ........ | 361/698 |
| 6,650,536 B2 * | 11/2003 | Lee et al. .............. | 361/687 |
| 6,778,394 B2 * | 8/2004 | Oikawa et al. ......... | 361/700 |
| 6,856,037 B2 * | 2/2005 | Yazawa et al. ......... | 290/43 |
| 6,906,919 B2 * | 6/2005 | Pokharna et al. ....... | 361/687 |
| 6,924,978 B2 | 8/2005 | DiStefano | |
| 6,926,070 B2 * | 8/2005 | Jenkins et al. .......... | 165/79 |

FOREIGN PATENT DOCUMENTS

| | | |
|---|---|---|
| CN | 2691053 Y | 4/2005 |
| CN | 2692837 Y | 4/2005 |

\* cited by examiner

*Primary Examiner*—Gregory D Thompson
(74) *Attorney, Agent, or Firm*—Winston Hsu

(57) ABSTRACT

A heat dissipation device (1) includes a heat sink (10), a fan (20), and an air cooling member (30). Airflow produced by the fan is led to the heat sink after passing through the air cooling member. The air cooling member can lower the temperature of the airflow below an average temperature of an atmosphere surrounding the heat dissipation device.

2 Claims, 5 Drawing Sheets

HEAT DISSIPATION DEVICE

DESCRIPTION

1. Field of the Invention

The present invention relates generally to a heat dissipation device, and more particularly to a heat dissipation device having a high heat dissipating capacity.

2. Description of Related Art

When a CPU of an electronic apparatus, for example, a computer is operated, heat must be quickly carried away from the CPU so that the operation of the CPU can be maintained normal. Conventional heat dissipating apparatus for this purpose are commonly comprised of a heat sink having a plurality of upright fins and adapted for mounting on the top of the CPU, and a fan adapted for mounting on the heat sink above the CPU. To provide excellent heat transfer, the heat sink is designed to have, generally, a large heat dissipating surface area. The size of the dissipating surface area of a heat sink can generally determine the heat dissipating capacity of the heat sink. One way to increase the dissipating surface area of the heat sink is to increase the length of the fins; however, to increase the length of the fins also increases a thickness of a border layer of air on a top surface of the fins. A border layer of air is a layer of stagnant air formed on a surface of an article. The thickness of the border layer of air is inversely proportional to the amount of heat that can be transferred from the surface of the heat sink to the surrounding air. Furthermore, the length of the fins can not be increased too long due to space limitations in modern computers. Therefore, to improve the heat dissipating capacity of the heat sink by increasing the surface of the heat sink has its limitation.

Another factor that can determine the heat dissipating capacity of a heat sink is the temperature difference between the heat sink and an airflow passing the heat sink. The temperature difference is proportional to the amount of heat that can be transferred from the heat sink. Generally, the average temperature of ambient air surrounding the heat sink is not much lower than that of the heat sink, and the temperature difference between the airflow and the heat sink is small. The amount of heat that is transferred from the heat sink to the airflow is limited.

Therefore, the heat dissipating capacity of the conventional heat dissipating apparatus is low, and need to be improved.

What is needed, therefore, is a heat dissipation device which has a high heat dissipating capacity.

SUMMARY OF INVENTION

A heat dissipation device comprises a heat sink, a fan and an air cooling member. Airflow produced by the fan is led to the heat sink after passing through the air cooling member. The air cooling member reduces the temperature of the airflow below an average temperature of the ambient air surrounding the heat dissipation device.

Other advantages and novel features will become more apparent from the following detailed description of preferred embodiments when taken in conjunction with the accompanying drawings, in which:

DETAILED DESCRIPTION

Figure 1:
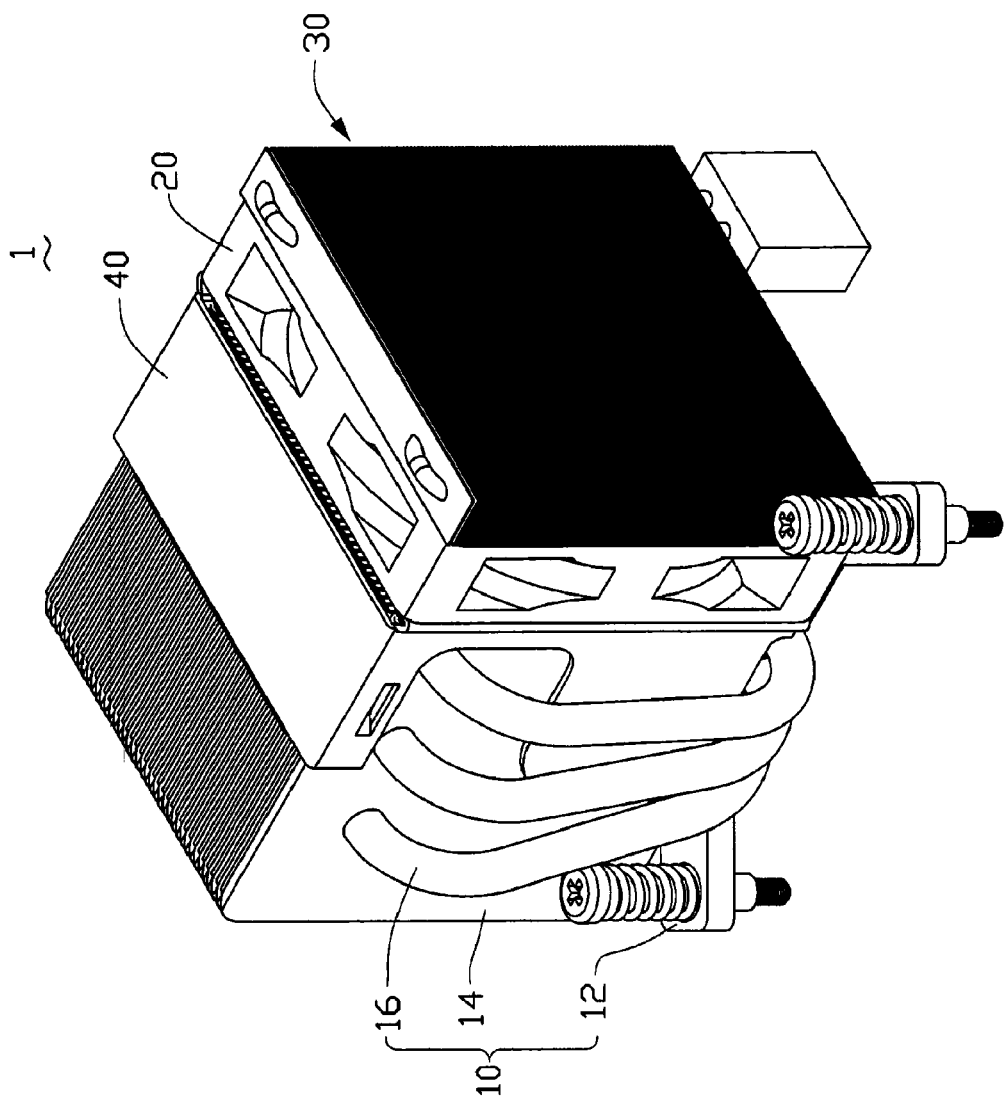
FIG. 1 is an assembled view of a heat dissipation device in accordance with a first preferred embodiment of the present invention.
Figure 2:
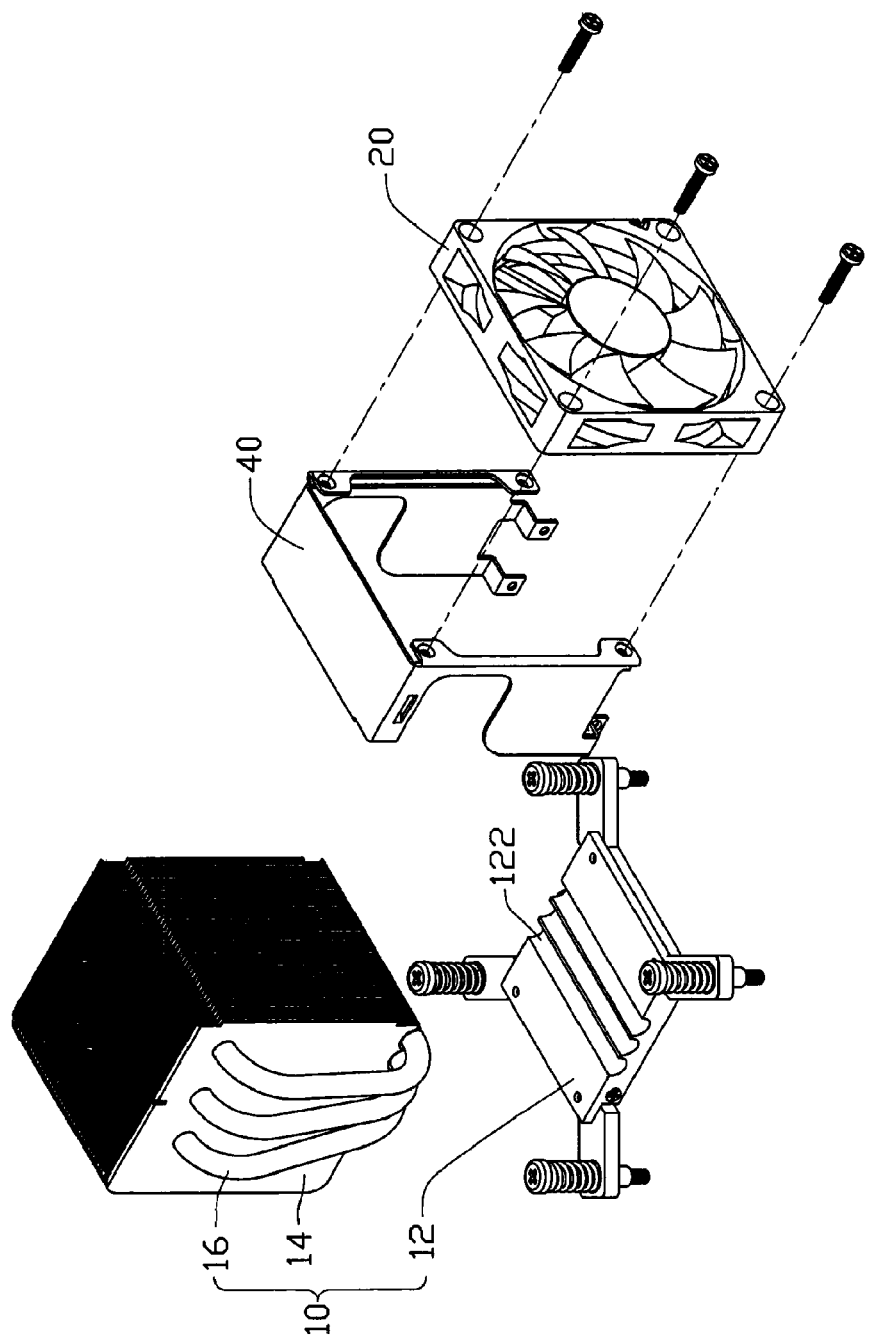
FIG. 2 is an exploded view of a heat sink and a fan of FIG. 1.

Referring to FIGS. 1-2, a heat dissipation device 1 of a preferred embodiment of the invention comprises a heat sink 10, a fan 20 and an air cooling member 30.

The heat sink 10 comprises a base 12, a plurality of fins 14 extending from the base 12 and three heat pipes 16 thermally connecting the base 12 with the fins 14. The base 12 defines grooves 122 (shown in FIG. 2) in a top surface thereof, and a bottom surface of the base 12 is attached to an electronic component (not shown). Each heat pipe 16 has an evaporating portion (not labeled) accommodated in one of the grooves 122 and a condensing portion (not labeled) inserted in the fins 14. The base 12 absorbs heat produced by the electronic component and transfers the heat directly to the fins 14 through the heat pipes 16. Then, the fins 14 dissipate the heat to a surrounding atmosphere via an airflow generated by the fan 20 and flowing through the heat sink 10.

The fan 20 is mounted on the heat sink 10 via a fan holder 40. The fan 20 has an inlet (not labeled) and an outlet (not labeled). The outlet and inlet of the fan 20 face the heat sink 10 and the air cooling member 30, respectively. In the preferred embodiment, the fan 20 is sandwiched between the heat sink 10 and the air cooling member 30.

Figure 3:
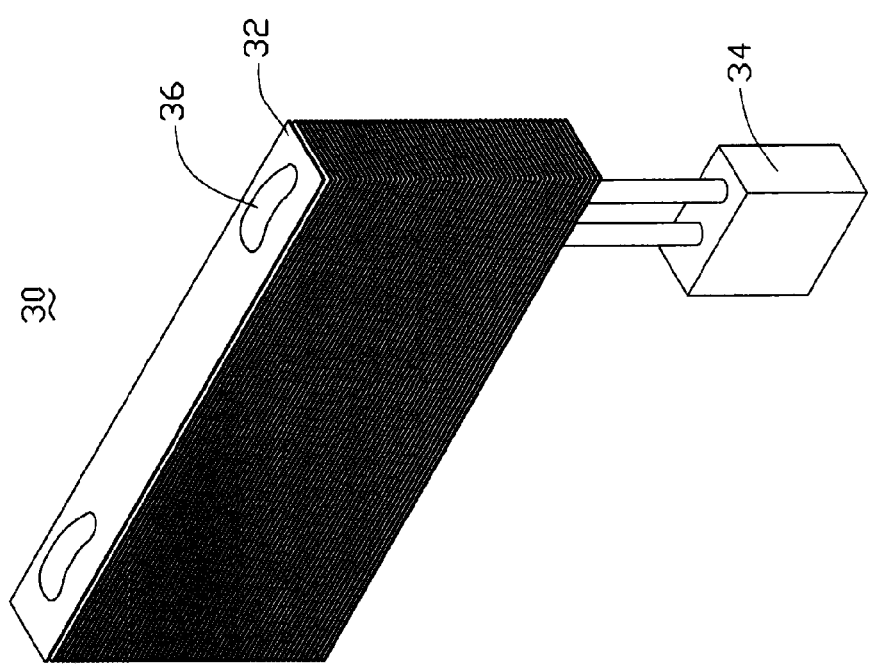
FIG. 3 is an enlarge view of an air cooling member of FIG. 1.
Figure 4:
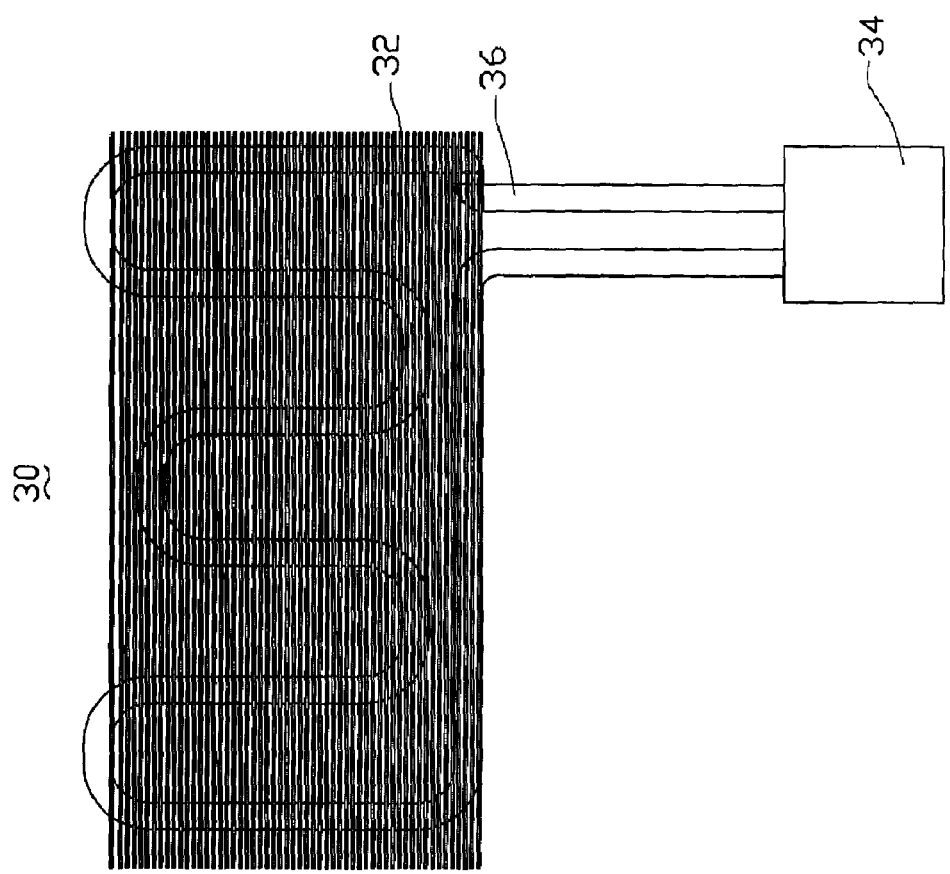
FIG. 4 is similar to FIG. 3, but viewed from another aspect.

Referring also to FIGS. 3-4, the air cooling member 30 is a liquid cooling system. The air cooling member 30 comprises a fins unit 32, a pump 34, and a pipe 36 having a serpentine configuration. The pipe 36 is fludically connected with the pump 34. The pump 34 circulates cooling liquid through the pipe 36. The pipe 36 is mounted through the fins unit 32 such that the fins unit 32 is cooled while the liquid flows through the pipe 36 through the fins unit 32. The pump 34 is located at a place far away from the fins unit 32, for example, a place outside a computer enclosure, which is much cooler than a place in the computer enclosure, so that the liquid can effectively lower the temperature of the fins unit 32 below an average temperature of an ambient air surrounding the heat dissipation device 1. In this case, the heat dissipation device 1 is mounted in the computer enclosure. Then, the liquid travels back to the pump 34 to be cooled. Therefore, airflow produced by the fan 20 is pre-cooled by the air cooling member 30 before entering into the heat sink 10. The airflow generated by the fan 20 has a temperature lower than the average temperature in the computer enclosure, since the airflow is cooled by the air cooling member 30. Therefore, the airflow can effectively take heat away from the heat sink 10 to lower the temperature of the electronic component.

Figure 5:
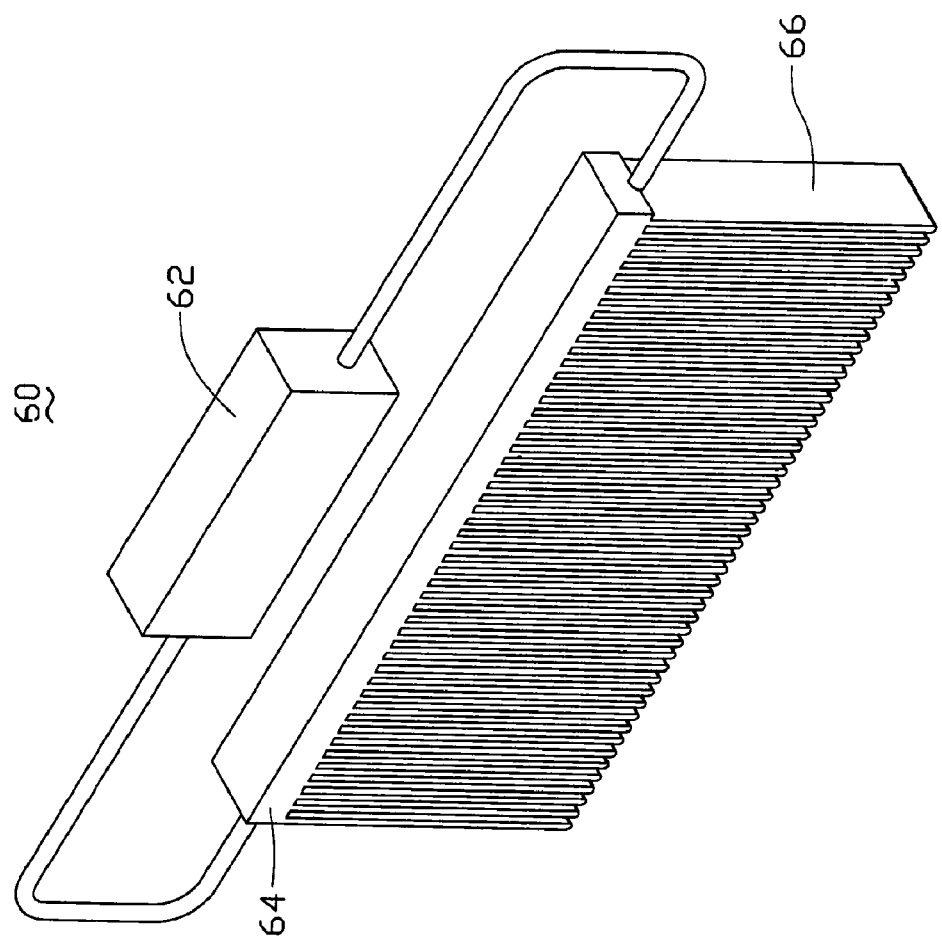
FIG. 5 is an assembled view of an air cooling member of a heat dissipation device in accordance with a second preferred embodiment of the present invention.

Other heat exchangers can also serve as the air cooling member, for example, a thermoelectric cooler 60 as shown in FIG. 5. The thermoelectric cooler 60 can replace the liquid cooling system as described above in the first preferred embodiment, and functions as the air cooling member.

Referring to FIG. 5, the thermoelectric cooler 60 comprises a power 62, a semiconductor 64 electrically connected to the power 62, and a fins assembly 66 mounted on a bottom surface of the semiconductor 64. The thermoelectric cooler (TEC) 60 is a cooling device that uses the Peltier effect for heat transfer. When a current is applied to the semiconductor 64, it will absorb heat from the bottom surface thereof which is in thermal contact with the fins assembly 66 and release the heat from a top surface thereof. Therefore, the fins assembly 66 is cooled. The airflow generated by the fan 20 can first pass through the fins assembly 66 to be cooled by the fins assembly 66. Then, the cooled airflow flows through the heat sink 10. The fins assembly 66 has a temperature lower than the average temperature in the computer enclosure in which the heat dissipation device 1 is mounted.

In the embodiments of present invention, the airflow produced by the fan 20 is led to the heat sink 10 after passing through the air cooling member 30 or the thermoelectric cooler 60. The airflow is pre-cooled before it enters into the heat sink 10. The temperature difference between the airflow and the heat sink 10 gets large, and more heat can be transferred away from the heat sink 10. Therefore, the heat dissipating capacity of the heat dissipation device 1 according to the present invention is improved.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a heat sink adapted for thermally contacting with a heat generating component of an electronic device;
   an air cooling member; and
   a fan having an outlet facing the heat sink and an inlet facing the air cooling member;
   wherein an airflow produced by the fan passes through the air cooling member and is cooled by the cooling member, and then flows into the inlet and out of the outlet of the fan, and finally flows through the heat sink; and
   wherein the fan is sandwiched between the heat sink and the air cooling member.

2. A heat dissipation device comprising:
   a heat sink adapted for contacting with a heat generating component;
   a fan generating an airflow through the heat sink;
   a cooling member lowering a temperature of the airflow below an average temperature of an environment surrounding the heat dissipation device before the airflow flows through the heat sink, wherein the cooling member has a plurality of fins and the airflow flows through the fins before flows through the heat sink;
   wherein the fan is sandwiched between the heat sink and the cooling member.

* * * * *